United States Patent
Mabuchi et al.

(10) Patent No.: US 7,086,362 B2
(45) Date of Patent: *Aug. 8, 2006

(54) AUTOMOTIVE ENGINE VALVE MECHANISM SYSTEM SHIM AND LIFTER OF THESE AND CAM SHAFT

(75) Inventors: Yutaka Mabuchi, Yokohama (JP); Yoshiteru Yasuda, Yokohama (JP); Masahiko Shioda, Yokohama (JP); Mototaka Ishihara, Yokohama (JP); Hisanori Ohara, Hyogo (JP); Kazuhiko Oda, Hyogo (JP); Yoshiharu Utsumi, Kyoto (JP); Miki Irie, Hyogo (JP)

(73) Assignee: Nissan Motor Co., Ltd., Yokohama (JP)

( * ) Notice: Subject to any disclaimer, the term of this patent is extended or adjusted under 35 U.S.C. 154(b) by 525 days.

This patent is subject to a terminal disclaimer.

(21) Appl. No.: 10/468,713

(22) PCT Filed: Sep. 27, 2002

(86) PCT No.: PCT/JP02/10057

§ 371 (c)(1),
(2), (4) Date: Aug. 22, 2003

(87) PCT Pub. No.: WO2004/029422

PCT Pub. Date: Apr. 8, 2004

(65) Prior Publication Data

US 2004/0154570 A1    Aug. 12, 2004

(51) Int. Cl.
  *F01L 1/14*    (2006.01)
(52) U.S. Cl. .............. 123/90.52; 123/193.4; 427/450

(58) Field of Classification Search .......... 123/90.52, 123/193.4; 427/450, 540; 428/698, 217
See application file for complete search history.

(56) References Cited

U.S. PATENT DOCUMENTS

| 5,205,188 A | 4/1993 | Repenning et al. |
| 5,776,600 A * | 7/1998 | Katayama et al. .......... 428/325 |
| 6,886,521 B1 * | 5/2005 | Hamada et al. .......... 123/193.4 |

FOREIGN PATENT DOCUMENTS

| EP | 1 067 211 A1 | 1/2001 |
| JP | 5-163909 A | 6/1993 |
| JP | 7-118832 A | 5/1995 |
| JP | 11-294118 A | 10/1999 |
| JP | 3051404 B1 | 3/2000 |

(Continued)

*Primary Examiner*—Thomas Denion
*Assistant Examiner*—Zalalem Eshete
(74) *Attorney, Agent, or Firm*—Foley & Lardner LLP

(57) ABSTRACT

Disclosed is a shim or a valve lifter for an automotive engine valve driving system that slides against a cam lobe of a camshaft to drive an intake/exhaust valve of an internal combustion engine. The shim or lifter has the top of a sliding surface thereof opposing the cam lobe and being coated with a hard carbon film. The hard carbon film has a surface hardness of 1500 to 4500 kg/mm² in terms of Knoop hardness, a thickness of 0.3 to 2.0 μm and a surface roughness Ry (μm) satisfying the following equation (A):

$$Ry < \{(0.75 - Hk/8000) \times h + 0.07/0.8\} \quad (A)$$

where h is the thickness (μm) of the hard carbon film; and Hk is the knoop hardness (kg/mm²) of the hard carbon film. By imparting durability, reliability and a low friction coefficient to the hard carbon film that is said to be low in ductility to prevent the hard carbon film from becoming cracked and separated when applied to the sliding portion.

8 Claims, 1 Drawing Sheet

FOREIGN PATENT DOCUMENTS

| | | |
|---|---|---|
| JP | 2000-297373 A | 10/2000 |
| JP | 2001-64005 A | 3/2001 |
| JP | 2001-316686 A | 11/2001 |
| JP | 2002-309912 A | 10/2002 |

* cited by examiner

AUTOMOTIVE ENGINE VALVE MECHANISM SYSTEM SHIM AND LIFTER OF THESE AND CAM SHAFT

TECHNICAL FIELD

The present invention relates to a shim and a valve lifter for an automotive engine valve driving system that have excellent characteristics and high durability, and a combination of such a shim or lifter and a camshaft. More specifically, the present invention relates to the technique for imparting durability, reliability and a low friction coefficient to a hard carbon film formed by PVD arc ion plating for surface treatment of the sliding portion of a valve driving member that opposes a cam lobe in an automotive internal combustion engine.

BACKGROUND ART

In an automotive internal combustion engine, the friction between a cam lobe and its opposing member, i.e. a valve lifter or a shim attached to an end of the valve lifter, accounts for 20% of the total engine mechanical loss especially in a low engine rotation speed range including idling speed. The technique of reducing the friction between the cam lobe and the lifter/shim is important to provide a direct improvement of vehicle fuel efficiency.

The cam lobe and the lifter slide against each other at the highest degree of surface pressure in the internal combustion engine. Mechanically, there is a moment at which a lubricant film does not exist between the cam lobe and the lifter. It can be thus said that the state of lubrication is extremely severe. In order to reduce the friction between the cam lobe and the lifter, it is effective to reduce direct contact (metal contact) between the cam lobe and the lifter and improve the state of lubrication by smoothing the surface roughness of both of the cam lobe and the lifter as well as to reduce the friction on metal contact by surface treating with e.g. a solid lubricant or by using an additive.

Based on the above facts, it has recently become common to smooth the surface roughness of a sliding portion of the lifter and then apply a hard thin film of e.g. titanium nitride (TiN) or chromium nitride ($Cr_2N$) to the sliding portion, or coat the sliding portion with a resinous material in which a solid lubricant of molybdenum disulfide ($MOS_2$) is dispersed.

By the way, the greatest merit of hard thin films formed by a PVD (Physical vapor deposition) method and a CVD (chemical vapor deposition) method is to be able to attain considerably high surface hardness as compared with that attained by another surface treating e.g. plating or by surface hardening e.g. heat treatment. It is expected that the application of such a hard thin film to the sliding member will provide more significant improvement in the wear resistance of the sliding member.

Under lubrication, the hard thin film can prevent the sliding member from wearing to deteriorate its surface roughness. This makes it possible to prevent the sliding member from wearing away its opposing member due to such a deterioration of surface roughness, to prevent the friction between the sliding member and the opposing member from becoming increased by their increased direct contact (metal contact), and to maintain the lubrication at the initial state over a long time period. Also, the hard thin film can be expected to provide the effect of achieving smoothed surface roughness due to its high hardness upon contact with the opposing member and to thereby improve the state of lubrication by the smoothed surface roughness of both of these members.

Further, it is known that amorphous carbon films such as a diamond-like carbon (DLC) film, which are one kind of hard thin film, have the property of a solid lubricant in addition to high hardness and show low friction coefficients under no lubrication.

In microscopic analysis, the contact of the sliding member with the opposing member under lubrication includes a region in which the sliding member slides against the opposing member via a lubricant film and a region in which the sliding member and the opposing member make direct contact (metal contact) between peaks of their surface roughness. It is expected that the application of the DLC film to the above-mentioned direct contact region will allow reduction in the friction without lubrication. In recent years, the application of the DLC film to the sliding member has been thus examined as a low-friction technique for the internal combustion engine.

However, the hard thin film formed by the PVD or CVD method has higher internal stress and much higher hardness than that formed by another surface treating e.g. plating. When being applied to the sliding member of a mechanical part, the hard thin film often presents such problems that the film becomes separated from its base and becomes cracked. In order to prevent the separation of the film, it has been proposed that an intermediate layer is provided to improve the adhesion between the film and the base and that the film is formed in a multilayer structure to lessen the internal stress of the film.

There are few proposals for preventing the cracking of the film and the separation of the film resulting from the film cracking by controlling the surface roughness and profile of the hard thin film, notably hard carbon film, as well as the surface roughness and profile of the opposing member.

One of the proposals is to control the roughness of the opposing member i.e. the cam (Japanese Laid-Open Patent Publication No. JP11-294118A). This proposal is based on the principle that the input of load to the film can be controlled to prevent the separation of the film by limiting the roughness of the cam to a given value or smaller.

Another proposal is to control the surface profile of the film, more specifically to control the height and amount of macro particles (droplets) remaining on the surface of the film formed by arc ion plating (Japanese Laid-Open Patent Publication No. JP7-118832A).

As a result of extensive researches, the inventors have found that, when the hard carbon film is formed by PVD arc ion plating on a lifter part, the film cannot always obtain sufficient durability in the above proposed methods.

In the proposal of controlling the roughness of the opposing member i.e. the cam (JP11-294118A), if the surface roughness of the hard carbon film formed by arc ion plating exceeds a given value, the film can be damaged from sliding and be separated due to the film damage without regard to the roughness of the cam.

In the proposal of controlling the surface profile of the film (JP7-118832A), the height and amount of macro particles (droplets) remaining on the film formed by arc ion plating are controlled to within certain limits so as to smooth the surface roughness of the opposing member in a short time and thereby prevent the opposing member from being ground too much. The above proposal is not designed through consideration of a detailed mechanism of film separation. The separation of the film can thus occur depending on the surface roughness and profiles of the film and of the opposing member, even when the surface profile of the film is within the certain limits. It has also become apparent from the researches made by the inventors that the hard carbon film needs to be controlled closely according to its film quality, because the hard carbon film is more likely to be brittle than the previously known films such as a TiN film and a CrN film.

For the reasons above, it is evident that the expected effects of the hard carbon film cannot be obtained sufficiently in the conventional proposals.

DISCLOSURE OF THE INVENTION

The present invention has been made in view of the above conventional problems and findings, and an object of the present invention is to allow a hard thin film, which is said to be low in ductility due to its much higher hardness than that attained by another surface treating e.g. plating, to attain durability, reliability and a low friction coefficient so as to be prevented from cracking and separation when applied to a sliding member, and to thereby provide a shim and a valve lifter for an automotive engine valve driving system that have excellent friction characteristics and high durability and a combination of such a shim or lifter and a camshaft.

As a result of extensive researches, the inventors have found that the above object can be achieved by adequately controlling the surface hardness and profile of the hard carbon film, notably DLC film, according to the surface hardness and thickness of the film as well as controlling the surface roughness and profile of the opposing member. The present invention has been accomplished based on this finding.

That is, a shim or a valve lifter for an automotive engine valve driving system according to the present invention, is designed to slide against a cam lobe of a camshaft so as to drive an intake/exhaust valve of an internal combustion engine. The shim or lifter is characterized in that the shim or lifter has the top of a sliding surface thereof opposing the cam lobe and being coated with a hard carbon film and that the hard carbon film has a surface hardness of 1, 500 to 4,500 kg/mm$^2$ in terms of Knoop hardness, a thickness of 0.3 to 2.0 µm and a surface roughness Ry (maximum height) (µm) satisfying the following equation (A):

$$Ry < \{(0.75 - Hk/8000) \times h + 0.07/0.8\} \quad (A)$$

where h is the thickness (µm) of the hard carbon film; and Hk is the knoop hardness (kg/mm$^2$) of the hard carbon film.

The shim or valve lifter for the automotive engine valve driving system according to the present invention is also characterized in that a base of the shim or lifter has a surface roughness of 0.03 µm or smaller in terms of Ra (arithmetic mean roughness) before the hard carbon film is formed on the base, and the sliding surface coated with the hard carbon film has a convexity of which maximum height is 10 µm or less.

The shim or valve lifter for the automotive engine valve driving system according to the present invention is further characterized in that the base of the shim or lifter has a surface hardness of 45 or higher in terms of HRC (Rockwell hardness) before the hard carbon film is formed on the base.

Furthermore, a combination of a shim or lifter and a camshaft for an automotive engine valve driving system according to the present invention includes the above-mentioned shim or lifter and a camshaft and is characterized in that a cam lobe of the camshaft opposing the cam or lifter has a surface roughness Ra of 0.08 µm or smaller and a maximum peak to valley height of 10 µm or less in a roughness profile taken along a direction of the camshaft at a nose thereof.

In the present invention, the input of load that the hard carbon film, notably DLC film, can tolerate depends on the thickness and hardness of the film. By adjusting the surface roughness and profiles of the film and of the opposing member adequately according to the sliding conditions of the film and the part to which the film is applied, it is therefore possible to control the input of load on the film to within certain limits, to prevent the film from becoming cracked and separated and to maintain the function of the film over a long time period.

Hereinafter, the present invention will be described in detail.

The present invention aims to form a hard carbon film by arc ion plating on a cam follower used as a valve drive member for an internal combustion engine, i.e. a shim or valve lifter that slides against a cam lobe, and to improve the reliability of the film by controlling the surface roughness and profiles of the film and of the opposing member.

As a result of the researches made by the inventors on the application of the hard carbon film by arc ion plating to the opposing member that slides against the cam lobe, it has become apparent that the occurrence of damage of the film and separation of the film resulting from the film damage during sliding can be influenced by the hardness, surface roughness and thickness of the film, the profile of the base and the surface roughness and profile of the opposing member.

It has been shown that, when the hard thin film is formed on the member opposing the cam sustains damage from sliding, such damage results in film cracking, microscopic film separation or more serious damage caused by scrubbing separated film fragments.

The load applied on the film can result in any film damage. If the film receives only a surface pressure caused by line contact of the cam lobe having a curvature with the plane shim, the film can be prevented from damage by controlling the thickness of the film to a given value or larger.

One cause for excessively large load on the film is a deposit in the film, which is characteristically formed by arc ion plating as previously known. The deposit is herein defined as particles coming from the metal target, i.e. the source of film forming material, in a cluster or molten state but not in an ionic or atomic state, and remaining in the film as they are. The hard carbon film is developed over the deposit so that the deposit remains within the film to form hard particulate protrusions.

These protrusions readily come off during sliding. If the resultant particles are caught into the contact between the cam lobe and the film, the film receives a pressure from the cam lobe via the particles. Such a localized pressure is much higher than a Hertzian surface pressure that is determined based on the macroscopic curvature of the cam lobe in consideration of elastic deformation, and becomes a cause of the film cracking.

Further, the film becomes subjected to shearing stress upon the sliding contact with the cam lobe. The damage of the film thus becomes developed radially outwardly in line form to cause macroscopic separation of the film.

Another cause for excessively large load on the film is too large surface roughness of the cam lobe. There are two cases: in one case, the above-mentioned localized pressure is increased by the peaks of the surface roughness of the cam lobe; and, in the other case, the cam and the shim make point contact rather than line contact due to their low smoothness.

Especially when the cam lobe and the shim make point contact due to their low smoothness, the cracking of the film becomes increasingly promoted under the combined influence of the above-mentioned deposit and the large surface roughness of the cam lobe.

It has also been shown by the inventors' researches that, while the cam lobe and the opposing member i.e. the shim or lifter coated with the hard carbon film slide against each other, the cracking of the film can be caused depending on the thickness and hardness of the film.

As the thickness of the film increases, the deformation of the film caused by pressing the particles against the film at a given load becomes small. As a result, the resistance of the film to cracking under the given load increases. In other words, the film needs to have a certain thickness depending on the load applied under the sliding condition. Further, the hardness and ductility of the film are generally traded off for each other, and the hardness of the film increase with decrease in the ductility of the film. In sum, the resistance of the film to cracking increases as the hardness of the film measurably decreases.

From the above researches, the inventors have found the technique of, in the case of applying the hard carbon film to the sliding portion of the member opposing the cam lobe, stably providing a low friction coefficient in the hard carbon film by controlling the surface roughness of the film according to the hardness and thickness of the film and by controlling the surface roughness of the cam lobe and the profiles of the shim or lifter base and the cam lobe.

Next, the grounds for controlling the surface hardness, thickness etc. of the hard carbon film and of the cam lobe sliding against the film in the present invention will be explained.

The reason for controlling the thickness of the PVD hard carbon film formed on the sliding portion of the shim or lifter opposing the cam lobe to 0.3 µm or larger as defined in Claim 1 of the present invention is as follows: it has experimentally shown that, if the thickness of the film is less than the above-specified value, there arises a crack in the film under a conceivable load input from the cam lobe.

On the other hand, the reason for controlling the thickness of the film to 2.0 µm or smaller is as follows: if the thickness of the film exceeds the above-specified value, the warping of the base becomes a problem as large internal stress occurs in the film during the process of film forming. The warping of the film results in point contact between the film and the cam lobe. When the thickness of the film exceeds the above-specified value, the cracking of the film can be thus accelerated indirectly due to such poor contact between the film and the cam lobe.

The surface roughness of the hard carbon film is controlled based on the relationship between the hardness and thickness of the film.

It has been experimentally shown that, when the hard carbon film has a Knoop hardness Hk, the depth h' at which the deposit particles or the roughness peaks of the cam lobe can be pushed into the film upon contact therebetween satisfies the following relationship:

$$h'/h = 0.6 - Hk/10000 \quad (1)$$

where h is the thickness of the hard carbon film.

As a result of the researches on various films, it has been also shown that the surface roughness Ry of the hard carbon film satisfies the following relationship:

$$a = 0.8Ry - 0.07 \quad (2)$$

where a is the height of the deposit remaining in the film.

The deposit remaining in the hard carbon film can be prevented from causing the damage of the film and the cracking and separation of the film resulting from the film damage, by controlling the surface roughness of the film. Namely, the deposit is desired to fit in the above push-in depth to satisfy the relationship of a<h'.

From the above-mentioned relationships, there is provided a requirement for the surface roughness of the film in Claim 1, as defined by the following equation (A):

$$Ry < \{(0.75 - Hk/8000) \times h + 0.07/0.8\} \quad (A).$$

In Claim 3, there is provided a requirement for the base of the shim or lifter on which the hard carbon film is formed.

As the thickness of the hard carbon film is very small, the surface roughness of the base is reflected to the surface roughness of the film. When the surface roughness of the base is large, the peaks of the surface roughness of the film can cause an increase in the surface pressure upon localized contact with the cam lobe to induce the cracking of the film. Depending on the profile of the base, the sliding surface is likely to become convex due to the residual stress of the hard carbon film after the film formation. It becomes apparent from the researches that, if the height of convexity is too large, the film and the cam lobe undesiredly make point contact rather than line contact so that the surface pressure on the film is increased by the deposit and foreign material caught into the contact between the film and the cam lobe.

It has been experimentally shown that the damage and cracking of the film and the separation of the film resulting from the film damage and separation can be avoided when the surface roughness Ra of the base is 0.03 µm or smaller and when the convexity of the sliding surface is eventually controlled to 10 µm or less after the hard carbon film is formed.

In Claim 4, there is provided a requirement for the surface hardness of the sliding portion of the shim or lifter base.

In the sliding contact between the cam lobe and the hard carbon film, the elastic deformation of the film at the sliding portion is largely influenced by not only-the hardness and thickness of the film but also the hardness of the base. If the hardness of the base is lower than a given value, the hard carbon film becomes subjected to excessively large stress owing to the deformation of the base. This results in the cracking of the film.

The maximum surface pressure generated by the sliding contact between the cam lobe and the film is about 0.5 to 0.7 GPa. It has been experimentally shown that, when the hardness of the base is 45 or higher in terms of HRC, the hard carbon film can be prevented from becoming cracked due to the deformation of the base even under the above-ranged surface pressure.

Claim 5 resides to the combination of the above-mentioned shim or lifter of the present invention and the camshaft, and there is provided a requirement for the surface roughness and profile of the cam lobe opposing the shim or lifter in Claim 5.

When the surface roughness Ra of the cam lobe is 0.08 µm or smaller, the hard carbon film can be prevented from becoming cracked due to the peaks of the surface roughness of the cam lobe. If the surface roughness of the cam lobe exceeds 0.08 µm, it becomes necessary to control the thickness of the hard carbon film to a larger value so that the acceptable thickness range of the film becomes extremely narrow.

Depending on the profile of the cam lobe taken in a direction of the camshaft, uneven sliding contact between the cam lobe and the opposing member is induced to significantly increase the surface pressure applied to the sliding portion. It becomes a cause of increasingly enhancing the influence of the deposit or the foreign material contained in lubricant oil caught into the contact between the cam lobe and the film. When the peak to valley height of the cam profile is 10 µm or less, the carbon film can be prevented from cracking.

In the above-described combination of the shim or lifter and the camshaft of the present invention, it is desirable that the hard carbon film for covering the top of the sliding surface of the shim of lifter is a diamond-like carbon (DLC) film formed by PVD, especially by arc ion plating (as defined in Claim 2). However, the hard carbon film is not limited to the above film, and can be a hard carbon film formed by any other known method.

According to the present invention, the surface roughness and profiles of the hard carbon film, notably DLC film, and of the opposing member are controlled as appropriate according to the surface hardness and thickness of the film. This makes it possible to allow the hard thin film, which is said to be low in ductility due to its much higher hardness than that attained by another surface treating e.g. plating, to attain durability, reliability and a low friction coefficient so as to be prevented from cracking and separation when applied to the sliding member. The shim or valve lifter for the automotive engine valve driving system and the combination of such a shim or lifter and the camshaft can be provided with excellent friction characteristics and high durability.

BEST MODE FOR CARRYING OUT THE INVENTION

Figure 1:
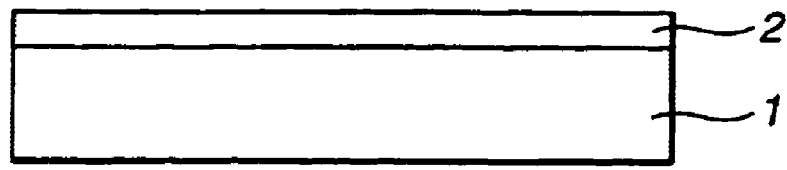
FIG. 1 is a sectional view of a shim coated with a hard carbon film according to an embodiment of the present invention.
Figure 2:
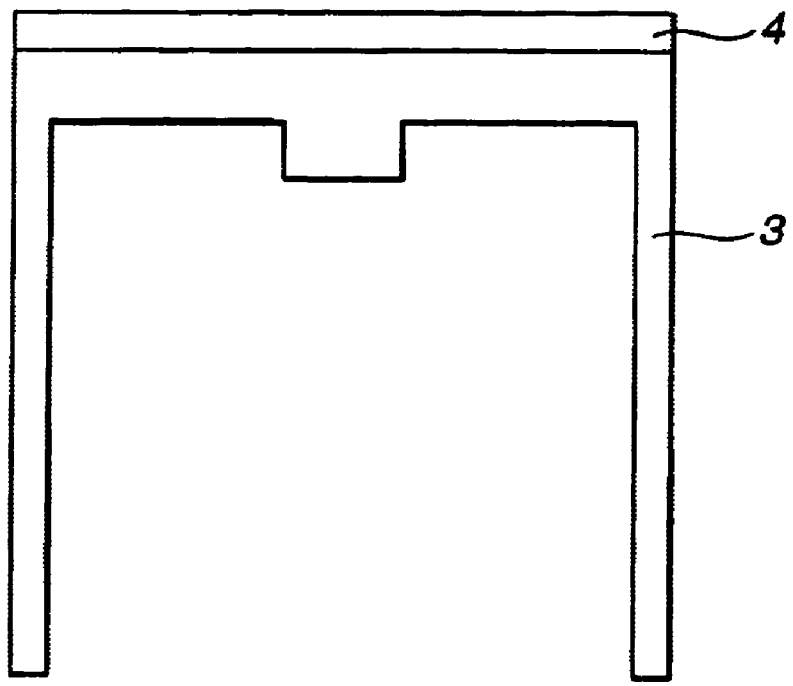
FIG. 2 is a sectional view of a valve lifter coated with a hard carbon film according to an embodiment of the present invention.

FIG. 1 shows a shim according to an embodiment of the present invention, and FIG. 2 shows a valve lifter according an embodiment of to the present invention. In FIGS. 1 and 2, reference numerals 1 to 4 denote a base of the shim, a hard carbon film, a base of the lifter and a hard carbon film, respectively.

The present invention will be described below in more detail by reference to Examples and Comparative Examples. However, it should be noted that these examples are not intended to limit the present invention thereto.

EXAMPLES 1 TO 6 AND COMPARATIVE EXAMPLES 1 TO 8

The effects of the present invention include the reduction of friction loss between the shim and the cam lobe through the application of the hard carbon film to the shim as well as the attainment of sufficient durability to maintain such a friction characteristic of the hard carbon film. In order to ensure these effects, the engine test of driving a camshaft directly by a motor was conducted using various combinations of cam lobes and shims having hard carbon films formed on their respective sliding portions so as to evaluate the degree of friction between the shim and the cam lobe and durability of the hard carbon film. The combinations of the cam lobes and the shims tested are indicated as Examples 1 to 6 and Comparative Examples 1 to 8 in TABLE 1.

Herein, all the hard carbon films used were formed by PVD arc ion plating and adjusted to their own specific surface hardness and thickness by controlling the film-forming conditions. In some cases, the hard carbon films were, after formed, subjected to grinding as needed so as to attain their respective predetermined surface hardness. Similarly, the cam lobe and the shim base were adjusted to there own specific hardness and forms by controlling the finishing conditions.

Next, the conditions of the engine test will be explained. The test unit used was designed corresponding to one bank (right-side bank) of a V-type six-cylinder 3000 cc engine, so as to drive the intake-side camshaft directly by the motor.

The torque caused by driving the camshaft one turn was averaged, and the thus-obtained average value was used as the measure of the friction between the cam lobe and the shim. The durability of the hard carbon film formed on the shim was evaluated by making sliding contact with the cam lobe for a fixed time period, and then, taking the shim apart from the cam lobe to check the occurrence of cracks in the film as well as the occurrence of separation of the film.

The evaluation of the degree of friction was carried out after the durability evaluation. For reference purposes, the test was also made on a shim coated with a manganese phosphate film that is now in widespread use. Every test was conducted by using a new test sample. The details of the test conditions are indicated below, and the test results of Examples and Comparative Examples are shown in TABLE 1.

Camshaft rotation speed: 2000 rpm (corresponding to crankshaft speed of 4000 rpm)
Test time for Durability evaluation: 100 hours
Timing of film check: 1 hour and 100 hours (at the time the durability evaluation test has completed)
Lubrication temperature: 110° C.
Friction evaluation: After the durability evaluation test has completed, the camshaft was kept rotating at 1000 rpm for 5 minutes to determine the average torque value.
Lubrication oil: commercially available engine oil based on 10W30SG
Material of valve lifter: SCM415 carburized material
Material of cam lobe (camshaft): FCA rutile cast iron

TABLE 1

Specifications of cam lobes and shims and test results

| | Valve lifter | | | | |
|---|---|---|---|---|---|
| No. | Surface treating | Film thickness h (µm) | Film surface hardness Hk: Knoop hardness | Film surface roughness Ry (µm) | Maximum roughness height Ry (µm)* as defined by Claim 1 |
| Ex. 1 | Hard carbon film | 0.35 | 1,983 | 0.15 | 0.26 |
| Ex. 2 | Hard carbon film | 1.90 | 4,050 | 0.42 | 0.55 |
| Ex. 3 | Hard carbon film | 0.80 | 4,020 | 0.23 | 0.29 |

TABLE 1-continued

Specifications of cam lobes and shims and test results

| No. | | | | | |
|---|---|---|---|---|---|
| Ex. 4 | Hard carbon film | 1.30 | 4,120 | 0.35 | 0.39 |
| Ex. 5 | Hard carbon film | 0.33 | 1,956 | 0.20 | 0.25 |
| Ex. 6 | Hard carbon film | 0.53 | 2,060 | 0.21 | 0.35 |
| Comp. Ex. 1 | Hard carbon film | 0.52 | 2,300 | 0.60 | 0.33 |
| Comp. Ex. 2 | Hard carbon film | 0.20 | 1,800 | 0.10 | 0.19 |
| Comp. Ex. 3 | Hard carbon film | 2.20 | 4,300 | 0.55 | 0.56 |
| Comp. Ex. 4 | Hard carbon film | 1.22 | 4,020 | 0.46 | 0.39 |
| Comp. Ex. 5 | Hard carbon film | 0.42 | 2,150 | 0.18 | 0.29 |
| Comp. Ex. 6 | Hard carbon film | 0.35 | 1,850 | 0.15 | 0.27 |
| Comp. Ex. 7 | Hard carbon film | 0.62 | 2,150 | 0.33 | 0.39 |
| Comp. Ex. 8 | Manganese phosphate film | 1.00 | — | 1.20 | — |

*$Ry = (0.75 - Hk/8000) \times h + 0.07/0.8$

| | Valve lifter | | | Cam lobe | |
|---|---|---|---|---|---|
| No. | Profile: convexity ($\mu m$) | Base hardness HRC | Base roughness Ra ($\mu m$) | Surface roughness Ra ($\mu m$) | Profile: valley ($\mu m$) |
| Ex. 1 | 3.5 | 60 | 0.01 | 0.05 | 4 |
| Ex. 2 | 8 | 53 | 0.02 | 0.04 | 3 |
| Ex. 3 | 6 | 58 | 0.01 | 0.04 | 5 |
| Ex. 4 | 7 | 57 | 0.03 | 0.03 | 6 |
| Ex. 5 | 3 | 60 | 0.01 | 0.08 | 7 |
| Ex. 6 | 5 | 50 | 0.01 | 0.05 | 3 |
| Comp. Ex. 1 | 4 | 58 | 0.01 | 0.04 | 5 |
| Comp. Ex. 2 | 3 | 60 | 0.02 | 0.06 | 4 |
| Comp. Ex. 3 | 12 | 52 | 0.01 | 0.05 | 5 |
| Comp. Ex. 4 | 6 | 53 | 0.06 | 0.05 | 3 |
| Comp. Ex. 5 | 4 | 60 | 0.03 | 0.12 | 4 |
| Comp. Ex. 6 | 4 | 56 | 0.02 | 0.07 | 12 |
| Comp. Ex. 7 | 5 | 40 | 0.01 | 0.08 | 6 |
| Comp. Ex. 8 | 2 | 60 | 0.10 | 0.06 | 5 |

| | Evaluation degree of durability | | Friction torque |
|---|---|---|---|
| No. | 1 hr. | 100 hr. | 1000 rpm (Nm) |
| Ex. 1 | ○ | ○ | 0.7 |
| Ex. 2 | ○ | ○ | 0.8 |
| Ex. 3 | ○ | ○ | 0.8 |
| Ex. 4 | ○ | ○ | 0.8 |
| Ex. 5 | ○ | ○ | 0.8 |
| Ex. 6 | ○ | ○ | 0.7 |
| Comp. Ex. 1 | X | — | — |
| Comp. Ex. 2 | X | — | — |
| Comp. Ex. 3 | X | — | — |
| Comp. Ex. 4 | Δ | X | — |
| Comp. Ex. 5 | X | — | — |
| Comp. Ex. 6 | Δ | X | — |
| Comp. Ex. 7 | Δ | X | — |
| Comp. Ex. 8 | (remain) | (wear-out) | 1.2 |

○: There was no damage in the film.
Δ: There was a microscopic separation of the film.
X: There was a macroscopic separation of the film. The test was suspended.
After the replacement of the shim with the new one having no film, the test was continued.

The test results shown in TABLE 1 will be explained below. Each of Examples 1 to 6 falls within the scope of the present invention, and it has been shown that all the combination of the cam lobes and the shims of Examples 1 to 6 attained much lower friction characteristics than that of the combination of the cam lobe and the manganese phosphate treated shim of Comparative Example 8. It has also been shown that, in Examples 1 to 6, the hard carbon films formed on the shims had almost no sign of damage, cracking and separation resulting from the film damage and cracking that can affect the friction characteristics of the films even after the 100-hr engine test, and showed sufficient durability.

In Comparative Example 1, there was a large amount of the deposit on the film surface so that the surface roughness of the shim was much larger than the upper limit given by substituting the roughness and thickness of the hard carbon film into the expression of Claim 1. The hard carbon film of Comparative Example 1 was found to be radially damaged and be macroscopically separated due to the film damage at the time of 1 hour after the start of the test.

In Comparative Example 2, the thickness of the hard carbon film formed on the shim was 0.2 μm to be smaller than the lower limit of 0.3 μm as defined in Claim 1. The hard carbon film of Comparative Example 2 was found to be separated due to film cracking at many places mainly in the center of the shim at the time of 1 hour after the test start.

In Comparative Example 3, the thickness of the hard carbon film formed on the shim was 2.2 μm to be larger than the upper limit of 2.2 μm as defined in Claim 1. Further, the convexity of the shim coated with the hard carbon film was 12 μm in height to be larger than the limit value of 10 μm as defined in Claim 3. The hard carbon film of Comparative Example 3 was found to be damaged radially and separated due to the film damage at the time of 1 hour after the start of the test.

In Comparative Example 4, the roughness Ra of the base of the shim was 0.06 μm to be higher than the limit value of 0.03 μm as defined in Claim 3. The hard carbon film of Comparative Example 4 was found to be separated along the processing pattern in the center of the shim at the time of 1 hour after the test start, and be separated macroscopically throughout the film at the time of 100 hours after the test start.

In Comparative Example 5, the surface roughness Ra of the cam lobe was 0.12 μm to be higher than the limit value of 0.08 μm as defined in Claim 5. The hard carbon film of Comparative Example 5 was found to be damaged radially and macroscopically separated due to the film damage at the time of 1 hour after the start of the test.

In Comparative Example 6, the valley height of the cam lobe was 12 μm to be larger than the limit value of 10 μm as defined in Claim 3. The hard carbon film of Comparative Example 6 was found to be separated due to film cracking mainly in the center of the shim at the time of 1 hour after the test start, and be separated throughout the film at the time of 100 hours after the start test.

In Comparative Example 7, the surface roughness HRC of the shim base was 40 to be lower than the limit value of 45 as defined in Claim 4. The hard carbon film of Comparative Example 7 was found to be separated due to film cracking mainly in the center of the shim at the time of 1 hour after the test start, and be separated throughout the film at the time of 1 hour after the test start.

For comparison of friction, the shim of Comparative Example 8 was given manganese phosphate treatment. The friction torque was 1.2 N/m in Comparative Example 8 to be much higher than those of Examples 1 to 6.

As described above, all of Examples had better friction characteristics and durability than those of Comparative Examples to ensure the effects of the present invention. It can be said that, in view of friction characteristics, Example 1 is most preferred at the present moment.

Although the present invention has been described with reference to specific embodiments of the invention, the invention is not limited to the above-described embodiments. Various modification and variation of the embodiment described above will occur to those skilled in the art in light of the above teaching.

The invention claimed is:

1. A shim or a valve lifter for an automotive engine valve driving system that slides against a cam lobe of a camshaft to drive an intake/exhaust valve of an internal combustion engine, the shim or lifter having the top of a sliding surface thereof opposing the cam lobe and being coated with a hard carbon film, said hard carbon film having a surface hardness of 1500 to 4500 kg/mm² in terms of Knoop hardness, a thickness of 0.3 to 2.0 μm and a surface roughness Ry (μm) satisfying the following equation (A):

$$Ry < \{(0.75 - Hk/8000) \times h + 0.07/0.8\} \quad (A)$$

where h is the thickness (μm) of the hard carbon film, and Hk is the knoop hardness (kg/mm²) of the hard carbon film.

2. The shim or lifter according to claim 1, wherein the hard carbon film is a DLC film made of carbon and formed by arc ion plating.

3. The shim or lifter according to claim 1, wherein a base of the shim or lifter has a surface roughness of 0.03 μm or smaller in terms of Ra before the hard carbon film is formed, and the sliding surface coated with the hard carbon film has a convexity of which maximum height is 10 μm or smaller.

4. The shim or lifter according to claim 1, wherein a base of the shim or lifter has a surface hardness of 45 or higher in terms of HRC before the hard carbon film is formed.

5. A combination of the shim or lifter according to claim 1 and a camshaft, wherein a cam lobe of the camshaft opposing the shim or lifter has a surface roughness Ra of 0.8 μm or smaller and a maximum peak to valley height of 10 μm or less in a roughness profile taken along a direction of the camshaft at a nose thereof.

6. A combination of the shim or lifter according to claim 2 and a camshaft, wherein a cam lobe of the camshaft opposing the shim or lifter has a surface roughness Ra of 0.8 μm or smaller and a maximum peak to valley height of 10 μm or less in a roughness profile taken along a direction of the camshaft at a nose thereof.

7. A combination of the shim or lifter according to claim 3 and a camshaft, wherein a cam lobe of the camshaft opposing the shim or lifter has a surface roughness Ra of 0.8 μm or smaller and a maximum peak to valley height of 10 μm or less in a roughness profile taken along a direction of the camshaft at a nose thereof.

8. A combination of the shim or lifter according to claim 4 and a camshaft, wherein a cam lobe of the camshaft opposing the shim or lifter has a surface roughness Ra of 0.8 μm or smaller and a maximum peak to valley height of 10 μm or less in a roughness profile taken along a direction of the camshaft at a nose thereof.

* * * * *